(12) United States Patent
Grützmacher

(10) Patent No.: US 7,078,335 B2
(45) Date of Patent: Jul. 18, 2006

(54) FORMATION OF SELF-ORGANIZED STACKED ISLANDS FOR SELF-ALIGNED CONTACTS OF LOW DIMENSIONAL STRUCTURES

(75) Inventor: Detlev Grützmacher, Lauchringen (DE)

(73) Assignee: Paul Scherrer Institut, Villigen (CH)

( * ) Notice: Subject to any disclaimer, the term of this patent is extended or adjusted under 35 U.S.C. 154(b) by 0 days.

(21) Appl. No.: 10/490,070

(22) PCT Filed: Sep. 5, 2002

(86) PCT No.: PCT/EP02/09921

§ 371 (c)(1),
(2), (4) Date: Sep. 17, 2004

(87) PCT Pub. No.: WO03/025989

PCT Pub. Date: Mar. 27, 2003

(65) Prior Publication Data

US 2005/0037556 A1  Feb. 17, 2005

(30) Foreign Application Priority Data

Sep. 18, 2001 (EP) .................................. 01122320

(51) Int. Cl.
*H01L 21/4763* (2006.01)
(52) U.S. Cl. ...................... 438/637; 438/258; 438/526; 257/19

(58) Field of Classification Search ................ 438/637
See application file for complete search history.

(56) References Cited

U.S. PATENT DOCUMENTS

| 6,271,551 B1 * | 8/2001 | Schmitz et al. ............. 257/288 |
| 6,727,550 B1 * | 4/2004 | Tezuka et al. ............. 257/347 |
| 6,841,410 B1 * | 1/2005 | Sasaoka ...................... 438/47 |
| 6,852,638 B1 * | 2/2005 | Johansson et al. .......... 438/710 |

\* cited by examiner

*Primary Examiner*—Thao P. Le
(74) *Attorney, Agent, or Firm*—Moetteli & Associes Sarl; John Moetteli

(57) ABSTRACT

Method for making a semiconductor structure is proposed. It comprises the steps: —providing a base layer (10) having a first lattice constant, —forming buried islands on the base layer (10) having a second lattice constant that is smaller or larger than the first lattice constant, —at least partially covering the base layer (10) and the buried islands with a cover layer (14), whereby the cover layer (14) has a locally increased or reduced lattice constant in areas above the buried islands, —growing small islands (15) on the areas of the cover layer (14) with locally increased or reduced lattice constant, —depositing a thin layer (16) at least partially covering the cover layer (14) and the small islands (15), —at least partially removing the small islands (15) to provide for an opening (17) being positioned exactly above the buried islands.

20 Claims, 3 Drawing Sheets

FORMATION OF SELF-ORGANIZED STACKED ISLANDS FOR SELF-ALIGNED CONTACTS OF LOW DIMENSIONAL STRUCTURES

The present application claims the benefit of and priority from PCT/EP02/09921 filed on Sep. 5, 2002, and EPO01122320.3 filed on Sep. 18, 2001.

The present invention concerns self-organized stacked islands, methods for making self-organized stacked islands, and devices based thereon. The invention is well suited for forming self-aligned contacts of low dimensional structures.

BACKGROUND OF THE INVENTION

More and more transistors are being integrated in integrated circuits (ICs) allowing to realize devices that satisfy the demand for powerful and flexible applications. The next generation of ICs is going to comprise transistors having a gate length (L) and a gate width (W) of 50 nm and below. In addition to the ongoing miniaturization of the integrated active—known as scaling—and passive elements, new materials and material compositions are being employed in order to increase the processing speed of the ICs and to Improve performance.

A typical example is the deployment of Silicon-Germanium (SiGe) on Silicon. One concept that was recently announced by IBM is based on strained silicon layers in relaxed SiGe layers. Called strained silicon, this concept stretches the materials, speeding the flow of electrons through transistors to increase the performance and decrease the power consumption in ICs. Fabrication of such devices is difficult. First, the growth of the relaxed buffer layer is, due to the required thickness in the range of a few microns, time consuming. This growth process may generate high defect densities and unfavorably low thermal conductance. Second, the high-quality oxide formation requires elevated temperatures, which in turn cause undesirable plastic strain relaxation and dislocation propagation into the active channel. Furthermore, the integration of p-type and n-type transistors on one common substrate is difficult.

A concept that avoids certain disadvantages of the strained silicon approach is described by O. G. Schmidt and K. Eberl in the paper, Self-Assembled Ge/Si Dots for Faster Field Effect Transistors, Max-Planck-Institut fur Festkbrperforschung, Stuttgart, Germany. The researchers propose to employ so-called buried islands. Nanostructured Ge-dots on silicon can serve as buried islands, for example. When the Ge-dots are grown in the Stranski-Krastanow mode with 3–5 monolayers of Ge, there is a strong misfit induced strain around such Ge-dots in the silicon. The position of the Ge-dots can be influenced by pre-structuring the silicon substrate, n-type and p-type transistors are described that have an increased charge flow. A yet unsolved problem is the alignment of the gate electrode with respect to a buried island. For a transistor having a gate length and gate width of less than 50 nm, the overlay accuracy has to be in the range of 20 nm or below. Certain aspects of the work reported in the paper by O. G. Schmidt and K. Eberl are also covered by the German patent application DE 100 25 264. This patent application is an earlier patent document that was published after the filing date of the present application.

It is an object of the present invention to provide a method for making improved active devices, such a n-type or p-type transistors.

It is an object of the present invention to provide improved active devices, such as n-type or p-type transistors.

It is an object of the present invention to provide a method for contacting small transistors or other devices and to provide devices based on this method.

SUMMARY OF THE PRESENT INVENTION

The present invention relies of a self assembly or self formation of islands above pre-fabricated buried islands. Lattice misfits introduced by the pre-fabricated buried islands are advantageously used for the formation of islands being stacked vertically above the buried ones. When growing a suitable layer, small islands nucleate exactly on top of the pre-fabricated buried islands. This nucleation is enforced by the misfits introduced by the pre-fabricated buried islands.

According to the present invention, a method for making a semiconductor structure is proposed. It comprises the steps:

providing a base layer having a first lattice constant, forming first islands on the base layer having a second lattice constant that is smaller or larger than the first lattice constant, burying the first islands (for sake of simplicity herein called buried islands) at least partially covering the base layer and the buried islands with a cover layer, whereby the cover layer has a locally increased or reduced lattice constant in areas above the buried islands, growing second islands (for sake of simplicity herein called small islands) on the areas of the cover layer with locally increased or reduced lattice constant, depositing a thin layer at least partially covering the cover layer and the small islands, at least partially removing the small islands to provide for an opening being positioned exactly above the buried islands.

Various advantageous methods are claimed in the dependent claims 2 through 8.

According to the present invention, a semiconductor device is proposed that is being made using the process in accordance with one of the claims 1 through 8.

It is an advantage of the invention presented herein, that the obstacles and disadvantages of known approaches can be circumvented or even avoided.

BRIEF DESCRIPTION OF THE DRAWINGS

For a more complete description of the present invention and for further objects and advantages thereof, reference is made to the following description, taken in conjunction with the accompanying drawings, in which.

DETAILED DESCRIPTION

Figure 1A:
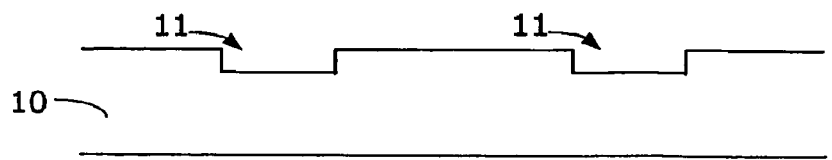
FIG. 1A–1H is a sequence of schematic cross-sections used to describe certain steps of a method for making a semiconductor device, according to the present invention.
Figure 1B:
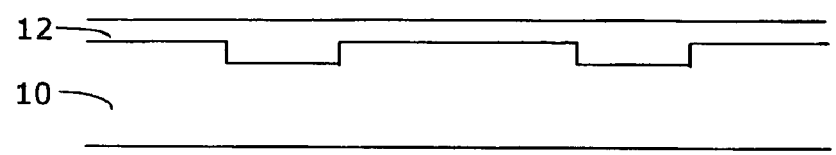
Figure 1C:
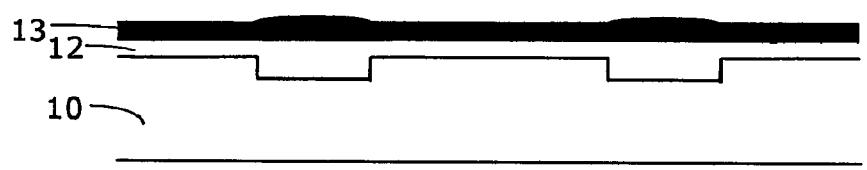
Figure 1D:
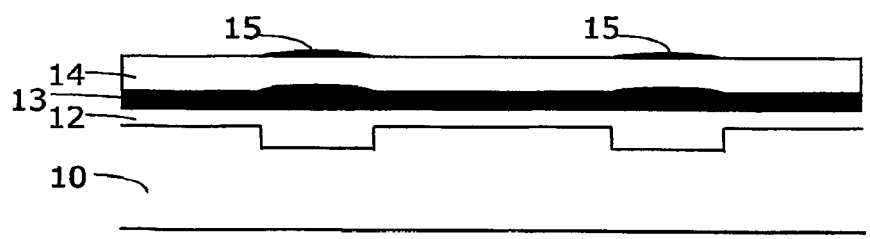

The present invention takes advantage of the tendency for atoms inside compounds to align with one another. When silicon, for example, is deposited on top of a substrate with atoms spaced farther apart, the silicon atoms stretch to line up with the atoms underneath, stretching or straining the silicon. In the strained silicon, for example, the electrons experience less resistance and flow up to 70 percent faster. This effect can be used to realize ICs that are up to 35 percent faster without even having to shrink the size of the individual transistors.

The silicon has slightly smaller spaces between the atoms than germanium's crystalline lattice. Germanium forms islands on a silicon surface due to this lattice mismatch between silicon and germanium. In the germanium islands the lattice is released towards the apex of the island. A subsequent layer of silicon grown on top of the islands is strained above the islands, since the germanium atoms tug at their silicon neighbors trying to get them to line up with the same spacing. This leads to stress or strain, depending on the combination and/or arrangement of layers.

According to the present invention, a substrate or base layer can be pre-structured or pre-patterned by forming buried islands.

A method for making a semiconductor structure, in accordance with the present invention, is described in connection with FIGS. 1A–1H. In a first step, a base layer or substrate 10 is provided. This base layer or substrate 10 comprises a material, e.g. silicon, having a first lattice constant. A 4″ silicon wafer (001 oriented) can be used as substrate, for example. In a next step, this base layer or substrate 10 is structured in order to form nucleation grooves or trenches 11. The position, shape and size of the grooves or trenches 11 can be defined by a lithographic process followed by an etch step. Well suited is a dry-etch step. In the present example, the grooves 11 are formed that have a depth between 5 nm and 10 nm. In a subsequent step, a first layer 12 is formed. This layer may comprise silicon, for example. On top of the first layer 12, a thin layer 13 is grown. This layer has to have a lattice constant that is different than the lattice constant of the layer 12. Well suited is a germanium layer formed on silicon. In regions above the nucleation grooves 11, the germanium grows more rapidly, thus resulting in a germanium layer 13 where the thickness is slightly increased above the nucleation grooves 11. The size of these so-called buried islands can be influenced by controlling the concentration of the germanium during the growth process.

In a subsequent step, the germanium layer 13 is at least partially covered by a cover layer 14 comprising a third material, such as silicon, for example. Due to the fact that there are buried germanium islands underneath the cover layer 14 which show a lattice mismatch with respect to silicon, strain fields exist around the buried islands. In other words, the cover layer 14 has a locally increased or reduced lattice constant in areas above the buried islands. Now, small islands 15 are formed by growing a fourth material, e.g., germanium, on top of the cover layer 14. The size of these so-called small islands 15 can be influenced by controlling the concentration of the germanium during this growth process. The small islands 15 can be smaller, larger or equal in lateral size as the buried islands underneath. Due to the fact that the fourth material tends to grow where there is a strain field on the cover layer 14, the small islands 15 are automatically aligned with respect to the buried islands. In other words, the small islands 15 are stacked on top of the buried islands.

Figure 1E:
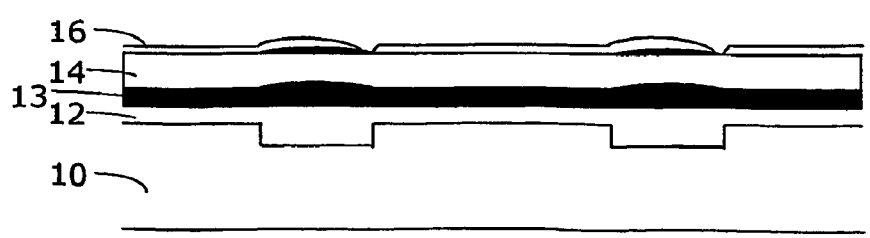
Figure 1F:
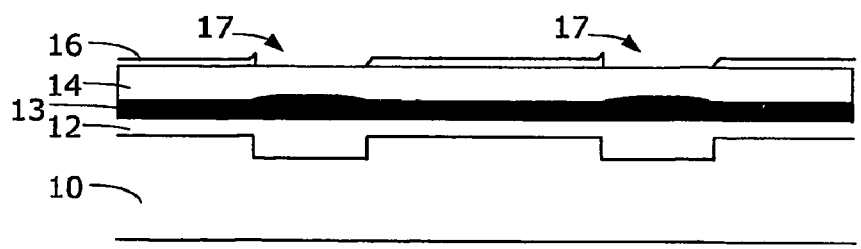

In order to be able to form a device, such as a transistor or the like, the small islands 15 are removed to provide for openings 17 being positioned exactly above the buried islands. In the FIG. 1E through 1H, exemplary steps are shown that allow to provide for the openings 17. As indicated in FIG. 1E, a thin layer 16 (e.g., $SiN_x$ or any other material is suited that is not selectively etched against the material of the small islands), is deposited. If this deposition is carried out under a certain angle, the thin layer 16 shows an uneven distribution close to the small islands 15 due to the so-called shadowing effect.

In a subsequent step, the small islands 15 can be removed using an appropriate etchant (lift-off process). Preferably, a selective etchant is employed that mainly attacks the small germanium islands 15 rather than the thin layer 16 and the cover layer 14. In the openings 17, the upper surface of the cover layer 14 is exposed. The different rates on the side walls on the small islands may be sufficient to reach a lift-off process.

Figure 1G:
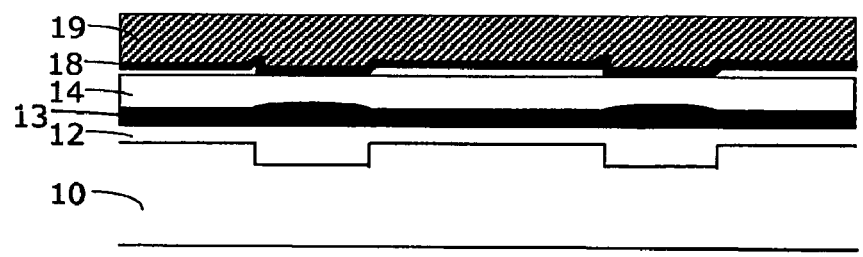
Figure 1H:
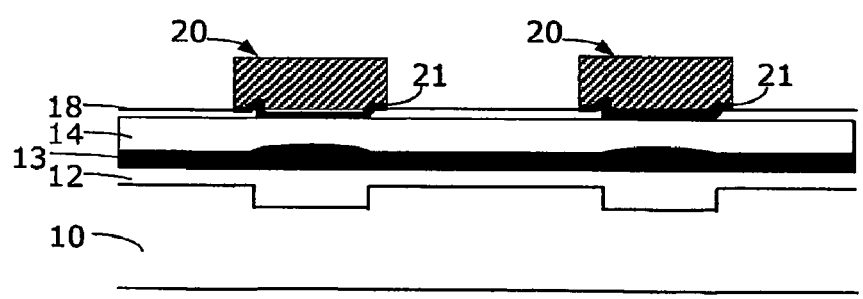

The process can be continued by depositing a thin dielectric layer 18 (e.g., a high-k material or an HT-CVD oxide serving as gate dielectricum) and a thicker layer 19 (e.g., polysilicon), as shown in FIG. 1G. Using photolithographic steps, the layers 18 and 19 can be structured according to the current needs. As shown in FIG. 1H, the layers 18 and 19 can be structured so that a gate dielectricum 21 and a gate electrode 20 is provided above the buried islands. The gate dielectricum 21 and the gate electrode 20 are automatically aligned with respect to the buried islands.

However, for the proposed transistor (DotFET), it is best to deposit an insulating layer 18 (e.g., $SiN_x$, $SiO_2$, or $CaF_2$) or a layer 18 comprising a high dielectric constant (k) material, such as $TiO_2$, $HfO_x$, $Al_2O_3$ etc. This can be easily seen in FIG. 1H, where the layer 18 restricts the gate area and relaxing therefor the overlay accuracy of the gate contact considerably.

Note that in connection with FIG. 1A–1H a process Is described that begins with a structured substrate or base layer 10. The structures on the substrate or base layer 10 are used to define the position of the buried islands. This approach allows the devices to be formed to be precisely positioned with respect to other devices on a chip, for example.

According to another embodiment of the present invention, an unstructured base layer or substrate is employed and randomly buried islands are formed. The position of these randomly distributed buried islands Is unknown since one or more layer(s) cover the buried islands. When forming the small islands, these small islands automatically grow in regions where there is a compressive or tensile strain. Due to this, one can form randomly distributed devices. This approach Is suited for making optic or electro-optic devices, for example. The manufacturing is much simpler and less costly.

Figure 3A:
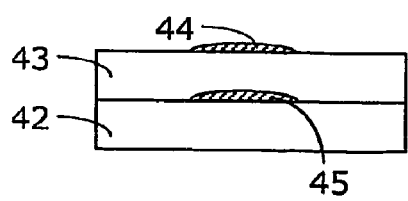
FIG. 3A–3B is a sequence of two schematic cross-sections used to describe the steps of oxidizing the silicon surface and germanium islands.
Figure 3B:
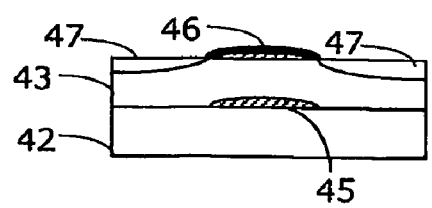

Instead of depositing a thin layer 16, one may oxidize the surface of a silicon layer 43 and the small Ge islands 44, as schematically depicted in FIGS. 3A and 3B. In the embodiment of FIG. 3A and 3B, there is a burried island 45 on a silicon layer 42. After the oxidization step, the surface of the silicon layer 43 comprises an oxide layer 47 and the Ge island 44 is covered by an oxide layer. Depending on the duration of the oxidization step, the Ge islands 44 might be completely transformed into an oxide 46. After the oxidization, the Ge island 44 can be selectively etched. In principle, all materials can be deposited as a thin layer on an island, which show a different chemical reaction with silicon and germanium. Examples are materials that form silicides.

Preferably, the size of the buried island is similar to or larger than the gate length of the transistor to be formed. Lateral sizes of buried islands between 0.01 microns and 0.5 microns are feasible. This lateral size is perfectly suited for the desired gate lengths in transistors.

Each of the two structures shown in FIG. 1H can be used to form a transistor (e.g., a Dot field-effect transistor also called DotFET), for example. Standard CMOS processes can be used for this purpose, as outlined in the following sections.

Implant regions can be formed in a subsequent step. When forming transistors, n+ and/or p+ implant regions can be formed on the left hand side and on the right hands side of the gate electrode 10, for example. After the formation of the implant regions, a side passivation layer can be formed at the gate electrode 20 and the necessary metallization can be provided by a sputter process, for example.

Figure 2:
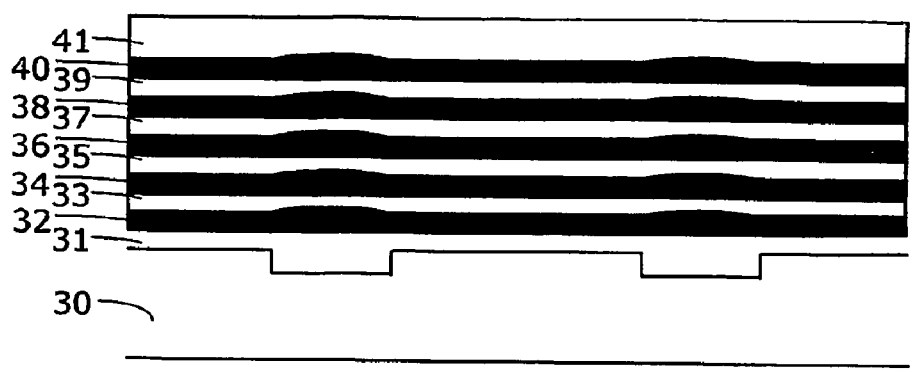
FIG. 2 is a schematic cross-section used to describe an intermediate step of another method, according to the present invention.

According to another embodiment, the buried islands comprise an alternating stack of germanium layers 32, 34, 36, 38, and 40 (each a few monolayers thick), and silicon layers 31, 33, 35, 37 and 39, as depicted in FIG. 2. On top of this stack of layers, there is a cover layer 41, e.g. comprising silicon. The small islands, according to the process described in connection with FIGS. 1D–1E can be formed on top of the cover layer 41. Devices can be realized by process steps similar to the ones described in connection with FIGS. 1E–1H.

According to yet another embodiment of the present invention, the pre-fabricated substrate comprises clusters of several buried islands. These islands are formed so that the strain field of each individual island overlaps with the strain fields of the other islands. I.e., in a layer above, the individual strain fields can no longer be resolved. According to the present invention, one can form an island on top of the cluster. This island is well aligned with the cluster underneath. The cluster of buried islands produce a stronger strain than a single buried island.

It is an advantage of the technology presented herein that it can be easily combined with current and future standard semiconductor processes, such as complementary metal-oxide-semiconductor (CMOS) processes.

The invention allows a precise alignment of a gate contact with respect to a buried island formed in or on a substrate, wherein there exists tensile stress or strain in the substrate close to the island.

The expression "island" is in the present context used as a synonym for quantum dots, buried nanocrystals, Ge-island in Si-substrate (also called Ge/Si dots), aggregation of islands, and so forth.

The islands as used in connection with the present invention typically have a size of a few nanometers. The strain field introduced by the buried islands extends far into the matrix of the surrounding substrate and/or the layer(s) above. Preferably, the islands are smaller than the buried islands.

The inventive method is advantageous, since it allows to position a small island exactly above the middle of the buried island. This allows to form a gate structure that itself is exactly aligned above the middle of the buried island. This is advantageous, since the strain field is the strongest in the region just above the middle (apex) of a buried island.

It is to be noted that the present invention is not limited to germanium and silicon. The same principle applies to III–V semiconductors such as GaAs/GaAlAs, GaInN/GaN/GaAlN/GaInAsN or InP/InGaAs and related compositions, II/VI semiconductors, and IV/VI semiconductors.

Due to the present invention the mobility can be enhanced and thus the speed of devices improved.

The inventive concept is well suited for use In transistors, sensors, spectroscopy, quantum computers, and other devices/systems.

Various methods can be used for the formation of the different layers. Well suited are molecular beam epitaxy (MBE), chemical vapor deposition (CVD), or ultra-high vacuum-chemical vapor deposition (UHV-CVD).

What is claimed is:

1. Method for making a semiconductor structure, comprising the steps:
   providing a base layer comprising a first material having a first lattice constant,
   forming buried islands on the base layer comprising a second material having a second lattice constant that is smaller or larger than the first lattice constant,
   at least partially covering the base layer and the buried islands with a cover layer comprising a third material, whereby the cover layer has a locally increased or reduced lattice constant in areas above the buried islands,
   growing small islands comprising a fourth material on the areas of the cover layer with locally increased or reduced lattice constant,
   depositing a thin layer at least partially covering the cover layer and the small islands,
   at least partially removing the small islands to provide for an opening being positioned exactly above the buried islands.

2. The method of claim 1, whereby the first material and the third material are the same material, preferably silicon.

3. The method of claim 1, whereby the second material and the fourth material are the same material, preferably germanium or a silicon-germanium composition.

4. The method of claim 1, whereby the thin layer comprises a dielectricum.

5. The method of claim 1, whereby the small islands are removed by a selective etch step.

6. The method of one of the claim 1, whereby the small islands are removed by a lift-off process.

7. The method of claim 1, comprising the step:
   depositing gate materials in order to form a gate electrode being laterally aligned relative to the buried islands.

8. The method of claim 1, wherein the buried islands comprise a few monolayers.

9. Semiconductor device being made using the process in accordance with claim 1.

10. Semiconductor device according to claim 9, whereby the device is a n-type transistor or a p-type transistor, preferably a n-type field-effect transistor or a p-type field-effect transistor.

11. Semiconductor device according to claim 9, whereby the device is a CMOS.

12. The method of claim 2, whereby the second material and the fourth material are the same material, preferably germanium or a silicon-germanium composition.

13. The method of claim 3, whereby the thin layer comprises a dielectricum.

14. The method of claim 3, whereby the small islands are removed by a selective etch step.

15. The method of one of the claim 3, whereby the small islands are removed by a lift-off process.

16. The method of claim 3, comprising the step:
  depositing gate materials in order to form a gate electrode being laterally aligned relative to the buried islands.

17. The method of claim 3, wherein the buried islands comprise a few monolayers.

18. Semiconductor device being made using the process in accordance with claim 2.

19. Semiconductor device being made using the process in accordance with claim 3.

20. Semiconductor device according to claim 10, whereby the device is a CMOS.

* * * * *